United States Patent
Yang et al.

(10) Patent No.: US 12,156,333 B2
(45) Date of Patent: Nov. 26, 2024

(54) METHOD AND CONFIGURATION FOR STACKING MULTIPLE PRINTED CIRCUIT BOARDS

(71) Applicant: Mellanox Technologies, Ltd., Yokneam (IL)

(72) Inventors: Xiuzhuang Yang, GuangDong (CN); Huiying Chen, GuangDong (CN); Weibin He, GuangDong (CN); Di Wu, GuangDong (CN)

(73) Assignee: Mellanox Technologies, Ltd., Yokneam (IL)

( * ) Notice: Subject to any disclaimer, the term of this patent is extended or adjusted under 35 U.S.C. 154(b) by 196 days.

(21) Appl. No.: 17/886,618

(22) Filed: Aug. 12, 2022

(65) Prior Publication Data

US 2024/0049393 A1 Feb. 8, 2024

(30) Foreign Application Priority Data

Aug. 4, 2022 (CN) .......................... 202210932955.5

(51) Int. Cl.
*H05K 1/02* (2006.01)
*H01G 4/012* (2006.01)
(Continued)

(52) U.S. Cl.
CPC ............. *H05K 1/145* (2013.01); *H05K 1/113* (2013.01); *H05K 1/141* (2013.01); *H05K 1/181* (2013.01);
(Continued)

(58) Field of Classification Search
CPC ........ H05K 1/02; H05K 1/023; H05K 1/0231; H05K 1/0306; H05K 1/113; H05K 1/115; H05K 1/141; H05K 1/145; H05K 1/162; H05K 1/181; H05K 1/182; H05K 1/185; H05K 1/186; H05K 3/32; H05K 3/388; H05K 3/3442; H05K 2201/0979; H05K 2201/09672; H05K 2201/1053; H05K 2201/10015; H05K 2201/10515; H05K 2201/10606; H01G 4/012; H01G 4/12;
(Continued)

(56) References Cited

U.S. PATENT DOCUMENTS 6,370,013 B1 * 4/2002 Iino ........................ H01L 23/642
361/309
6,859,352 B1 * 2/2005 Kanasaki ............. H05K 1/0231
257/E23.079

(Continued)

*Primary Examiner* — Xiaoliang Chen
(74) *Attorney, Agent, or Firm* — R. W. McCord Rayburn; Moore & Van Allen PLLC (57) ABSTRACT

Electronic devices, electronic modules, and methods for manufacturing electronic devices and/or electronic modules are described herein. In some embodiments, the present invention may be directed to an electronic module that includes a pair of printed circuit boards (PCBs) and a capacitor positioned between the PCBs. Each of the PCBs may include a pair of vias configured to provide electrical connections through the PCB, and the capacitor may include a pair of pins. Each pin of the capacitor may be aligned with a via of one of the PCBs and a corresponding via of the other PCB such that each pin is configured to provide electrical connection between the two PCBs. Additionally, the pair of pins may be configured to support the PCBs with respect to each other.

16 Claims, 5 Drawing Sheets

(51) Int. Cl.
*H01G 4/12* (2006.01)
*H01G 4/224* (2006.01)
*H01G 4/232* (2006.01)
*H01G 4/248* (2006.01)
*H01G 4/30* (2006.01)
*H01G 4/33* (2006.01)
*H01G 4/40* (2006.01)
*H01L 23/22* (2006.01)
*H01L 23/498* (2006.01)
*H01L 23/50* (2006.01)
*H01L 23/544* (2006.01)
*H05K 1/11* (2006.01)
*H05K 1/14* (2006.01)
*H05K 1/18* (2006.01)
*H05K 3/32* (2006.01)
*H05K 3/34* (2006.01)
*H01G 4/38* (2006.01)

(52) U.S. Cl.
CPC ............ *H05K 3/3442* (2013.01); *H01G 4/385* (2013.01); *H05K 2201/09672* (2013.01); *H05K 2201/10015* (2013.01); *H05K 2201/10515* (2013.01); *H05K 2201/1053* (2013.01); *H05K 2201/10606* (2013.01)

(58) Field of Classification Search
CPC .. H01G 4/30; H01G 4/33; H01G 4/40; H01G 4/224; H01G 4/232; H01G 4/248; H01G 4/302; H01G 4/385; H01G 4/2325; H01L 23/22; H01L 23/27; H01L 23/50; H01L 23/498; H01L 23/544; H01L 23/642; H01L 23/49816
USPC ......... 361/768, 302, 306.2, 306.3, 309, 728, 361/748, 760, 761, 763, 782; 174/251, 174/255, 258, 260
See application file for complete search history.

(56) References Cited

U.S. PATENT DOCUMENTS

| | | | | |
|---|---|---|---|---|
| 6,876,554 B1* | 4/2005 | Inagaki | | H01L 23/642 |
| | | | | 257/E23.079 |
| 6,970,362 B1* | 11/2005 | Chakravorty | | H01L 23/642 |
| | | | | 257/E23.079 |
| 7,532,453 B2* | 5/2009 | Yamamoto | | H05K 1/0231 |
| | | | | 361/306.3 |
| 10,699,844 B1* | 6/2020 | Saita | | H01L 23/58 |
| 11,581,148 B2* | 2/2023 | Hiraoka | | H01G 4/33 |
| 2004/0257749 A1* | 12/2004 | Otsuka | | H05K 1/162 |
| | | | | 257/E23.079 |
| 2006/0014327 A1* | 1/2006 | Cho | | H05K 1/185 |
| | | | | 438/125 |
| 2006/0158863 A1* | 7/2006 | Hsu | | H01L 23/49816 |
| | | | | 257/E23.079 |
| 2006/0191711 A1* | 8/2006 | Cho | | H05K 1/185 |
| | | | | 361/764 |
| 2006/0198079 A1* | 9/2006 | Shim | | H01G 2/06 |
| | | | | 361/306.3 |
| 2007/0045815 A1* | 3/2007 | Urashima | | H01L 23/5383 |
| | | | | 257/E23.079 |
| 2007/0076392 A1* | 4/2007 | Urashima | | H01L 24/81 |
| | | | | 257/E23.07 |
| 2007/0105278 A1* | 5/2007 | Kariya | | H01L 21/6835 |
| | | | | 257/678 |
| 2007/0121273 A1* | 5/2007 | Yamamoto | | H01G 4/232 |
| | | | | 257/E23.07 |
| 2007/0263364 A1* | 11/2007 | Kawabe | | H05K 1/0231 |
| | | | | 257/E23.079 |
| 2008/0055873 A1* | 3/2008 | Mi | | H01L 23/642 |
| | | | | 29/829 |
| 2009/0073667 A1* | 3/2009 | Chung | | H01L 23/3114 |
| | | | | 257/532 |
| 2009/0215231 A1* | 8/2009 | Inoue | | H01L 23/5389 |
| | | | | 257/E21.02 |
| 2009/0266594 A1* | 10/2009 | Yoshikawa | | H05K 1/162 |
| | | | | 216/17 |
| 2010/0181285 A1* | 7/2010 | Tanaka | | H05K 1/162 |
| | | | | 216/17 |
| 2010/0300602 A1* | 12/2010 | Ichiyanagi | | H01L 23/50 |
| | | | | 156/89.12 |
| 2011/0018099 A1* | 1/2011 | Muramatsu | | H05K 1/162 |
| | | | | 257/532 |
| 2012/0080222 A1* | 4/2012 | Kim | | H01L 24/17 |
| | | | | 174/260 |
| 2013/0170154 A1* | 7/2013 | Lee | | H05K 1/185 |
| | | | | 361/748 |
| 2013/0221485 A1* | 8/2013 | Kim | | H05K 1/185 |
| | | | | 257/532 |
| 2013/0258623 A1* | 10/2013 | Zeng | | H05K 1/186 |
| | | | | 29/840 |
| 2014/0116761 A1* | 5/2014 | Lee | | H01G 4/232 |
| | | | | 174/258 |
| 2015/0136449 A1* | 5/2015 | Yamashita | | H05K 3/4602 |
| | | | | 174/251 |
| 2015/0325375 A1* | 11/2015 | Song | | H05K 1/185 |
| | | | | 29/25.03 |
| 2016/0055976 A1* | 2/2016 | Song | | H01G 4/12 |
| | | | | 29/846 |
| 2020/0066622 A1* | 2/2020 | Jain | | H01L 23/49822 |
| 2022/0293500 A1 | 9/2022 | Vilner et al. | | |
| 2022/0346223 A1 | 10/2022 | Seri et al. | | |
| 2022/0377907 A1 | 11/2022 | Mentovich et al. | | |
| 2022/0377912 A1 | 11/2022 | Atias et al. | | |
| 2023/0007788 A1 | 1/2023 | Atias et al. | | |

\* cited by examiner

METHOD AND CONFIGURATION FOR STACKING MULTIPLE PRINTED CIRCUIT BOARDS

CROSS-REFERENCE TO RELATED APPLICATION

The present application claims the benefit of Chinese Patent Application No. 202210932955.5 for a "Method and Configuration for Stacking Multiple Printed Circuit Boards" filed Aug. 4, 2022, which is hereby incorporated by reference in its entirety.

FIELD OF THE INVENTION

The present invention relates to a method and configuration for stacking multiple printed circuit boards (PCBs).

BACKGROUND

In an effort to reduce the size of modern electronic products, designers typically use multiple PCBs in a stacked structure. Such stacked structures require a bridge to create current paths between PCBs. Conventional stacked PCBs include pillars for providing a current path and mechanical connection between the PCBs. Additionally, when conventional stacked PCBs are mounted on one side of a system board (e.g., a system PCB), vias are formed in the system board to electrically connect a capacitor mounted on the other side of the system board to provide input and output decoupling.

SUMMARY

The following presents a simplified summary of one or more embodiments of the present invention, in order to provide a basic understanding of such embodiments. This summary is not an extensive overview of all contemplated embodiments and is intended to neither identify key or critical elements of all embodiments nor delineate the scope of any or all embodiments. This summary presents some concepts of one or more embodiments of the present invention in a simplified form as a prelude to the more detailed description that is presented later.

In one aspect, the present invention is directed to an electronic module that includes a first printed circuit board (PCB) including a first pair of vias configured to provide electrical connections through the first PCB and a second PCB including a second pair of vias configured to provide electrical connections through the second PCB. The electronic module may include a capacitor positioned between the first PCB and the second PCB, where the capacitor includes a pair of pins, where each pin is aligned with a via of the first pair of vias and a corresponding via of the second pair of vias such that each pin is configured to provide electrical connection between the first PCB and the second PCB, and where the pair of pins is configured to support the first PCB with respect to the second PCB.

In some embodiments, the electronic module may include one or more electronic components on a distal side of the first PCB with respect to the capacitor, where the one or more electronic components is configured to be electrically connected to each via of the first pair of vias.

In some embodiments, the electronic module may include one or more electronic components on a distal side of the second PCB with respect to the capacitor, where the one or more electronic components is configured to be electrically connected to each via of the second pair of vias.

In some embodiments, the first PCB may include a first pair of pads, where each pad of the first pair of pads is configured to electrically connect the first pair of vias to the pair of pins and the second PCB may include a second pair of pads, where each pad of the second pair of pads is configured to electrically connect the second pair of vias to the pair of pins.

In some embodiments, each pin of the pair of pins may include a first surface affixed to the first PCB and a second surface affixed to the second PCB.

In some embodiments, the pair of pins of the capacitor may form a current bridge between the first PCB and the second PCB.

In some embodiments, the capacitor may include a dielectric material disposed between the pair of pins.

In some embodiments, the second pair of vias of the second PCB may be configured to provide electrical connection between the second PCB and a system PCB.

In some embodiments, the electronic module may include a frame assembly, where the frame assembly is configured to provide electrical connection between the pair of pins of the capacitor and (1) the first PCB using the first pair of vias and (2) the second PCB using the second pair of vias and support the first PCB with respect to the second PCB.

In some embodiments, the capacitor may be a first capacitor, and the electronic module may include a third PCB having a first side and a second side, a second capacitor positioned between the first PCB and the second PCB, a third capacitor and a fourth capacitor positioned between the second PCB and the first side of the third PCB, and a fifth capacitor and a sixth capacitor positioned on the second side of the third PCB.

In another aspect, the present invention is directed to a method of manufacturing an electronic device. The method may include providing a first printed circuit board (PCB) including a first pair of vias configured to provide electrical connections through the first PCB and providing a second PCB including a second pair of vias configured to provide electrical connections through the second PCB. The method may include positioning a capacitor including a pair of pins between the first PCB and the second PCB such that each pin, of the pair of pins, is electrically aligned with a via of the first pair of vias and a corresponding via of the second pair of vias. The method may include securing each pin, of the pair of pins, to the first PCB and the second PCB. In some embodiments, the pair of pins may be configured to (1) support the first PCB with respect to the second PCB and (2) form a current bridge between the first PCB and the second PCB.

In some embodiments, the method may include forming the first pair of vias in the first PCB and forming the second pair of vias in the second PCB.

In some embodiments, the method may include positioning and securing one or more electronic components on a distal side of the first PCB with respect to the capacitor such that the one or more electronic components is electrically connected to each via of the first pair of vias.

In some embodiments, the method may include forming a first pair of pads on the first PCB before securing each pin to the first PCB and forming a second pair of pads on the second PCB before securing each pin to the second PCB. Each pad of the first pair of pads may be configured to electrically connect to a via of the first pair of vias, and each pad of the second pair of pads may be configured to electrically connect to a via of the second pair of vias.

Additionally, or alternatively, securing each pin to the first PCB may include securing each pin, of the pair of pins, to a pad of the first pair of pads, and securing each pin to the second PCB may include securing each pin, of the pair of pins, to a pad of the second pair of pads.

In some embodiments, the method may include positioning the second PCB such that a first via of the second pair of vias is aligned with an input pad of a system board and a second via of the second pair of vias is aligned with an output pad of the system board and securing the second PCB to the system board.

In some embodiments, the method may include, before positioning the capacitor, positioning a frame assembly on the capacitor, where the frame assembly is configured to provide electrical connection between the pair of pins of the capacitor and (1) the first PCB using the first pair of vias and (2) the second PCB using the second pair of vias and support the first PCB with respect to the second PCB.

In yet another aspect, the present invention is directed to an electronic module that includes a first printed circuit board (PCB) including a first pair of vias configured to provide electrical connections through the first PCB and a second PCB including a second pair of vias configured to provide electrical connections through the second PCB. The electronic module may include a capacitor assembly configured to form a current bridge between the first PCB and the second PCB and a frame assembly at least partially housing the capacitor assembly and positioned between the first PCB and the second PCB. In some embodiments, the frame assembly may be configured to provide electrical connection between the capacitor and (1) the first PCB using the first pair of vias and (2) the second PCB using the second pair of vias, and the frame assembly may be configured to support the first PCB with respect to the second PCB.

In some embodiments, the capacitor assembly may include a capacitor, where the capacitor includes a dielectric material disposed between a pair of pins, and where each pin, of the pair of pins, is aligned with a via of the first pair of vias and a corresponding via of the second pair of vias.

In some embodiments, the capacitor assembly may include a first capacitor and a second capacitor, where the first capacitor includes a first dielectric material disposed between a first pair of pins, where the second capacitor includes a second dielectric material disposed between a second pair of pins, and where the first pair of pins and the second pair of pins form a current bridge between the first PCB and the second PCB.

In some embodiments, the first PCB may include a first pair of pads, where each pad of the first pair of pads is configured to electrically connect the first pair of vias to the frame assembly and the second PCB may include a second pair of pads, where each pad of the second pair of pads is configured to electrically connect the second pair of vias to the frame assembly.

In some embodiments, the electronic module may include one or more electronic components on a distal side of the first PCB with respect to the capacitor assembly, where the one or more electronic components is configured to be electrically connected to each via of the first pair of vias.

The features, functions, and advantages that have been discussed may be achieved independently in various embodiments of the present invention or may be combined with yet other embodiments, further details of which may be seen with reference to the following description and drawings.

BRIEF DESCRIPTION OF THE DRAWINGS

Having thus described embodiments of the invention in general terms, reference will now be made the accompanying drawings, wherein:

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Furthermore, when it is said herein that something is "based on" something else, it may be based on one or more other things as well. In other words, unless expressly indicated otherwise, as used herein "based on" means "based at least in part on" or "based at least partially on." Also, as used herein, the term "or" is intended to be inclusive when used in a series and may be used interchangeably with "and/or," unless explicitly stated otherwise (e.g., if used in combination with "either" or "only one of"). Like numbers refer to like elements throughout. No element, act, or instruction used herein should be construed as critical or essential unless explicitly described as such.

As noted above, conventional stacked PCBs include pillars for providing a current path and mechanical connection between the PCBs. Additionally, when conventional stacked PCBs are mounted on one side of a system board, vias are formed in the system board to electrically connect a capacitor mounted on the other side of the system board to provide input and output decoupling. However, the pillars and vias of conventional stacked PCBs introduce parasitic inductance to the current path of the modules. The parasitic inductance causes a low frequency resonance, which affects system performance, increases component stress, and requires system designers to compensate for the resonance in other ways.

Figure 1A:
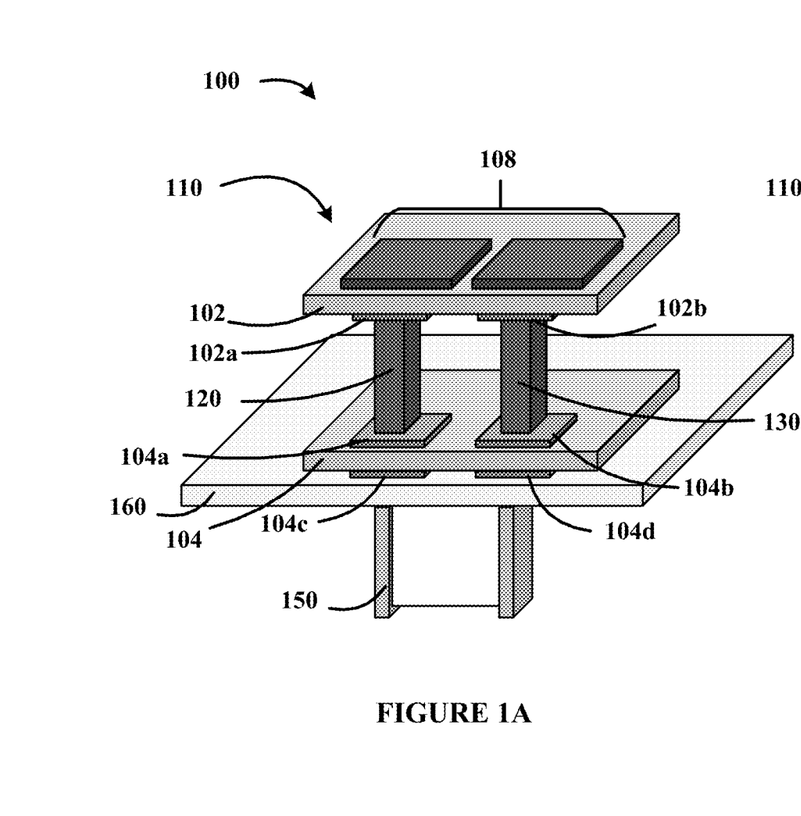
FIG. 1A is a perspective view of an electronic device including an electronic module with stacked PCBs.
Figure 1B:
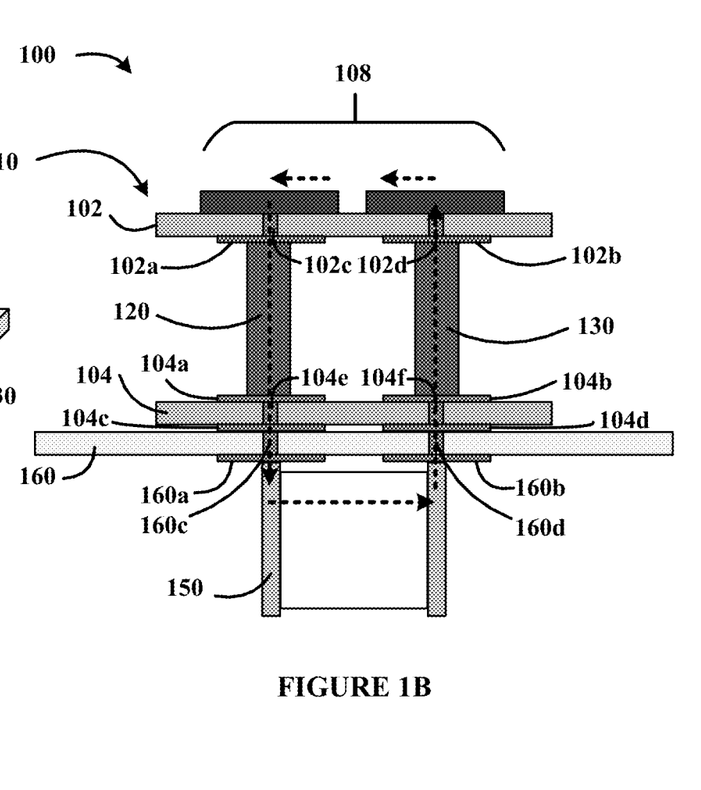
FIG. 1B is a cross-sectional, front view of the electronic device of FIG. 1A.

For example, FIGS. 1A and 1B illustrate an electronic device 100 including an electronic module 110 with stacked PCBs 102 and 104. In particular, FIG. 1A is a perspective view of the electronic device 100, and FIG. 1B is a cross-sectional, front view of the electronic device. As shown in FIGS. 1A and 1B, the electronic module 110 includes a first PCB 102 and a second PCB 104 connected by a first pillar 120 and a second pillar 130. The electronic module 110 is mounted on one side of a system board 160, and a capacitor 150 is mounted on the other side of the system board 160. The electronic module 110 also includes electronic components 108 mounted on the first PCB 102. Although not shown in FIGS. 1A and 1B, electronic components may also be mounted on the second PCB 104. As will be appreciated by those of ordinary skill in the art, FIGS. 1A and 1B depict a simplified and/or representative design for an electronic device including conventional stacked PCBs.

As shown in FIGS. 1A and 1B, the first PCB 102 includes a first PCB pad 102a and a second PCB pad 102b to provide electrical and mechanical connections (e.g., via solder) to the first pillar 120 and the second pillar 130, respectively. In this regard, electrical connections may comprise conductivity that allows an electrical current to pass therethrough, whereas mechanical connections may provide structural support and stability as between the respective components between which the mechanical connections are made. Additionally, the second PCB 104 includes a first PCB pad 104a and a second PCB pad 104b to provide electrical and mechanical connections (e.g., via solder) to the first pillar 120 and the second pillar 130, respectively. The second PCB 104 also includes a third PCB pad 104c and a fourth PCB pad 104d to provide electrical and mechanical connections (e.g., via solder) to input and output pads (not shown) of the system board 160.

As shown in FIG. 1B, the first PCB 102 includes a first via 102c and a second via 102d to provide electrical connections between the first pillar 120 and the second pillar 130, respectively, and the electronic components 108 on the top side of the first PCB 102. Additionally, the second PCB 104 includes a first via 104e and a second via 104f to provide electrical connections between the first pillar 120 and the second pillar 130, respectively, and the system board 160. Furthermore, the system board 160 includes a first via 160c and a second via 160d to provide electrical connections between the electronic module 110 and the capacitor 150.

The dashed arrows shown in FIG. 1B represent the current path (e.g., an alternating current (AC) noise loop, a switching noise path, and/or the like) through the electronic module 110. As shown by the current path in FIG. 1B, the vias in the first PCB 102 (i.e., the first via 102c and the second via 102d), the first pillar 120, the second pillar 130, the vias in the second PCB 104 (i.e., the first via 104e and the second via 104f), and the vias in the system board 160 (i.e., the first via 160c and the second via 160d) form the current path in the electronic module 110. However, these vias and pillars introduce parasitic inductance that will impact the decoupling performance of the electronic device 100 and requires system designers to compensate for the resonance in other ways. Assuming each via contributes the same amount of parasitic inductance $L_{via}$ and each pillar contributes a parasitic inductance $L_{pillar}$ to the design, the total parasitic inductance $L_{total}$ of the electronic module 110 can be estimated by the following equation:

$$L_{total} = 6 \times L_{via} + 2 \times L_{pillar}.$$

In contrast to conventional electronic modules, embodiments of electronic modules in accordance with the present invention position a capacitor between the PCBs such that the pins of the capacitor provide a current path and mechanical connection between the PCBs. Positioning the capacitor between the PCBs eliminates the need for pillars between the PCBs, thereby reducing the total parasitic inductance of the electronic module. Furthermore, positioning the capacitor between the PCBs eliminates the need for a capacitor on the opposite side of the system board (e.g., system PCB), thus removing vias in the system board from the current path and, as a result, eliminating the parasitic inductance caused by such vias. In some embodiments, a frame may be positioned around the pins to provide additional stability and/or to permit two stacked capacitors to be positioned between the PCBs.

Figure 2A:
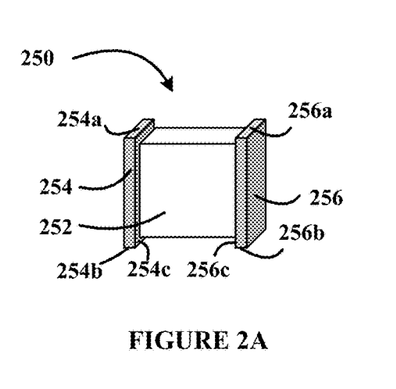
FIG. 2A is a perspective view of a capacitor, in accordance with an embodiment of the invention.

FIG. 2A is a perspective view of a capacitor 250, in accordance with an embodiment of the invention. As shown in FIG. 2A, the capacitor 250 may include a dielectric material 252 (e.g., a ceramic material and/or the like) disposed and/or positioned between a pair of pins, namely a first pin 254 and a second pin 256. The pins 254, 256 may be, for example, terminals, plates, and/or the like. In some embodiments, and as shown in FIG. 2A, the first pin 254 may include a first surface 254a (e.g., an upper surface), a second surface 254b (e.g., a lower surface) on an opposite side from the first surface 254a, and a third surface 254c to which the dielectric material 252 is connected. Similarly, the second pin 256 may include a first surface 256a (e.g., an upper surface), a second surface 256b (e.g., a lower surface) on an opposite side from the first surface 256a, and a third surface 256c to which the dielectric material 252 is connected.

In some embodiments, the first surfaces 254a and 256a may be configured to be affixed to a first PCB, and the second surfaces 254b and 256b may be configured to be affixed to a second PCB (e.g., via soldering). In this way, the first pin 254 and the second pin 256 may provide a current path and mechanical connection between the PCBs. As will be appreciated by those of ordinary skill in the art in view of this disclosure, FIG. 2A depicts a simplified and/or representative design for a capacitor in accordance with an embodiment of the invention, and other embodiments may include capacitors with different designs (e.g., differently configured pins, terminals, plates, dielectric materials, and/or the like) for providing a current path and/or mechanical connection between PCBs.

Figure 2B:
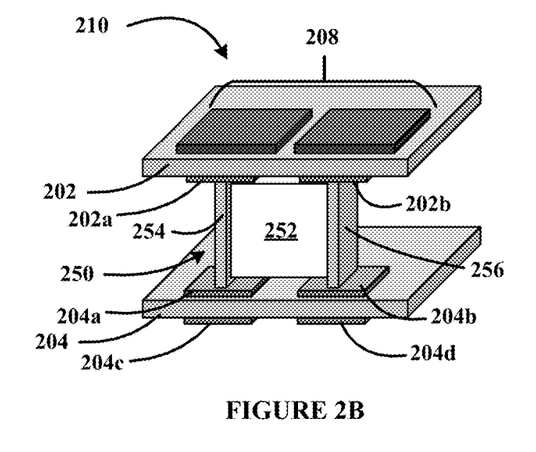
FIG. 2B is a perspective view of an electronic module including stacked PCBs, in accordance with an embodiment of the invention.

FIG. 2B is a perspective view of an electronic module 210 including stacked PCBs 202 and 204, in accordance with an embodiment of the invention. As shown in FIG. 2B, the electronic module 210 may include the capacitor 250 of FIG. 2A disposed and/or positioned between a first PCB 202 and a second PCB 204. As also shown in FIG. 2B, the electronic module 210 may include one or more electronic components 208 mounted on the first PCB 202. Although not shown in FIG. 2B, electronic components may also be mounted on the second PCB 204.

As shown in FIG. 2B, the first PCB 202 may include a first PCB pad 202a and a second PCB pad 202b that are configured to provide electrical and mechanical connections to the first pin 254 and the second pin 256, respectively. Additionally, the second PCB 204 may include a first PCB pad 204a and a second PCB pad 204b that are configured to provide electrical and mechanical connections to the first pin 254 and the second pin 256, respectively.

Figure 2C:
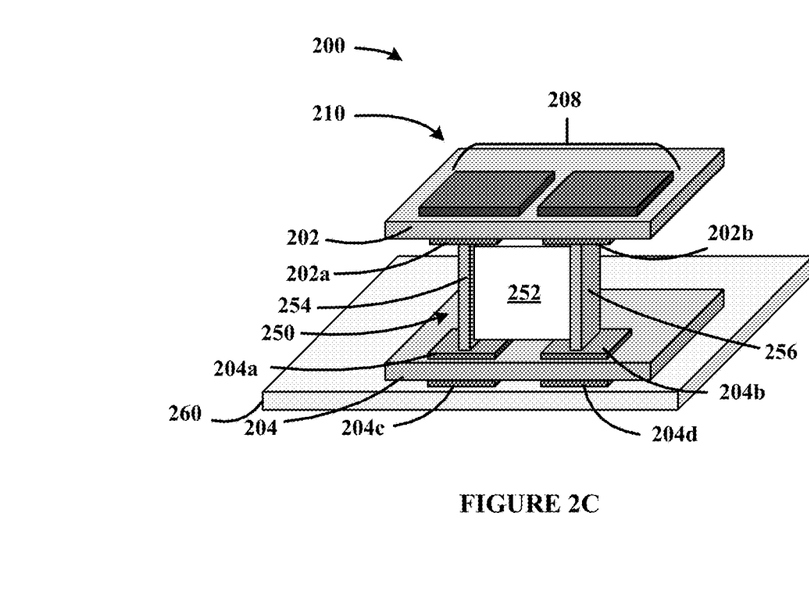
FIG. 2C is a perspective view of an electronic device including the electronic module of FIG. 2B, in accordance with an embodiment of the invention.
Figure 2D:
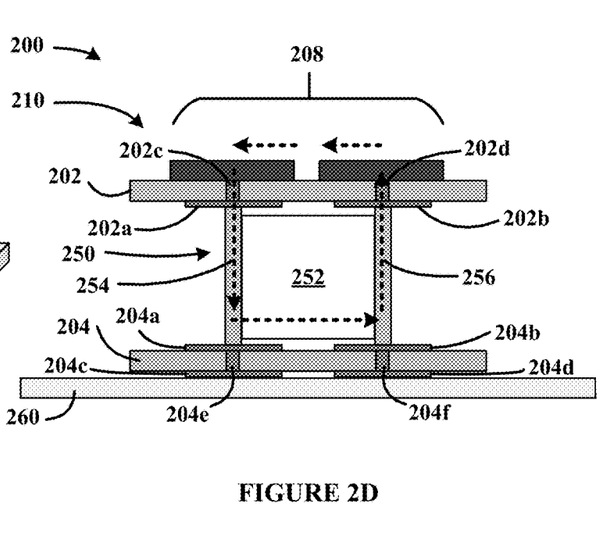
FIG. 2D is a cross-sectional, front view of the electronic device of FIG. 2C.

FIGS. 2C and 2D illustrate an electronic device 200 including the electronic module 210 of FIG. 2B. In particular, FIG. 2C is a perspective view of the electronic device 200, and FIG. 2D is a cross-sectional, front view of the electronic device 200. As shown in FIGS. 2C and 2D, the electronic device 200 may include a system board 260 (e.g., a system PCB), and the second PCB 204 may include a third PCB pad 204c and a fourth PCB pad 204d to provide electrical and mechanical connections to input and output pads (not shown) of the system board 260.

As shown in FIG. 2D, the first PCB 202 may include a first via 202c and a second via 202d to provide electrical connections between the first pin 254 and the second pin 256, respectively, and the electronic components 208 on the top side of the first PCB 202. Additionally, the second PCB 204 may include a first via 204e and a second via 204f to provide electrical connections between the first pin 254 and the second pin 256, respectively, and the system board 260. In some embodiments, and as shown in FIG. 2D, because the capacitor 250 is located on the same side of the system board 260 (e.g., between the first PCB 202 and the second PCB 204), the system board 260 may not include vias, as there may be no need to provide electrical connections between the electronic module 210 and other electronic components on the other side of the system board 260.

As will be appreciated by those of ordinary skill in the art in view of this disclosure, FIGS. 2B, 2C, and 2D depict a simplified and/or representative design for an electronic module and an electronic device. For example, each of the first PCB 202 and the second PCB 204 may include more than one pair of vias (e.g., several vias with respect to a pin and/or the like). As another example, electronic modules in accordance with embodiments of the present invention may include vias in the system board and/or pillars between PCBs. However, such vias and/or pillars may not be in the current path and, therefore, may not introduce parasitic inductance into the current path of the electronic module.

The arrows shown in FIG. 2D represent the current path (e.g., an alternating current (AC) noise loop, a switching noise path, and/or the like) through the electronic module 210. As shown by the current path in FIG. 2D, the vias in the first PCB 202 (i.e., the first via 202c and the second via 202d), the first pin 254, and the second pin 256 provide electrical connections within the electronic module 210. As noted, vias introduce parasitic inductance that may impact the decoupling performance of the electronic device 200. However, assuming each via contributes a parasitic inductance $L_{via}$ to the design, the total parasitic inductance $L_{total}$ of the electronic module 210 can be estimated by the following equation:

$$L_{total} = 2 \times L_{via}.$$

Thus, electronic modules in accordance with embodiments of the present invention typically have a total parasitic inductance that is lower than that in a conventional electronic module. Reducing the total parasitic inductance permits system designers to use less expensive components. Furthermore, electronic modules in accordance with embodiments of the present invention do not require the use of pillars (e.g., the first pillar 120 and the second pillar 130 of FIGS. 1A and 1B) to connect stacked PCBs, which reduces the total size of the electronic modules as compared to conventional electronic modules.

Electronic modules in accordance with embodiments of the present invention may, in some cases, include a capacitor assembly and/or a frame assembly positioned between stacked PCBs (e.g., rather than just a capacitor as shown in FIGS. 2B, 2C, and 2D). For example, an electronic module may include multiple capacitors positioned between stacked PCBs, where the pins (e.g., terminals, plates, and/or the like) of the capacitors cooperate to provide a current path and mechanical connection between the PCBs. As another example, an electronic module may include a frame assembly at least partially housing one or more capacitors, where the frame assembly includes a pair of frames positioned on either end of the one or more capacitors (e.g., for increasing stability of the mechanical connection between the PCBs). In such exemplary electronic modules, the frame assembly (e.g., in conjunction with the pins of the one or more capacitors) may provide a current path and mechanical connection between the PCBs.

Figure 3A:
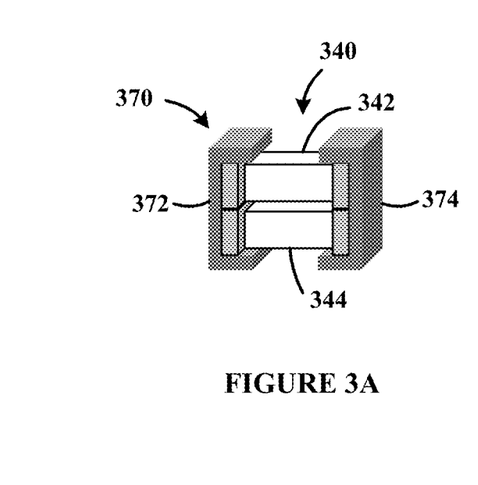
FIG. 3A is a perspective view of a capacitor assembly and a frame assembly, in accordance with an embodiment of the invention.

FIG. 3A is a perspective view of a capacitor assembly 340 and a frame assembly 370, in accordance with an embodiment of the invention. As shown in FIG. 3A, the capacitor assembly 340 may include a first capacitor 342 and a second capacitor 344. In some embodiments, each of the first capacitor 342 and the second capacitor 344 may be similar to the capacitor 250 shown and described herein with respect to FIGS. 2A-2D. For example, the first capacitor 342 and the second capacitor 344 may each include a dielectric material disposed and/or positioned between a pair of pins (e.g., terminals, plates, and/or the like).

As shown in FIG. 3A, the first capacitor 342 and the second capacitor 344 may be vertically aligned such that lower surfaces of the pins of the first capacitor 342 are respectively positioned on upper surfaces of the pins of the second capacitor 344 (e.g., to form the capacitor assembly 340). As will be appreciated by those of ordinary skill in the art in view of this disclosure, FIG. 3A depicts a simplified and/or representative design for capacitors in accordance with an embodiment of the invention, and other embodiments may include capacitors with different designs (e.g., differently configured pins, terminals, plates, dielectric materials, and/or the like).

As also shown in FIG. 3A, the frame assembly 370 may include a pair of frames, namely, a first frame 372 and a second frame 374. In some embodiments, each of the first frame 372 and the second frame 374 may be configured to couple and/or securely hold together the pins of the first capacitor 342 and the corresponding pins of the second capacitor 344 in a vertical alignment. Additionally, or alternatively, each of the first frame 372 and the second frame 374 may be formed of electrically conductive material (e.g., copper, iron, and/or the like). In some embodiments, each of the first frame 372 and the second frame 374 may have a shape configured to reduce its inductance. As will be appreciated by those of ordinary skill in the art in view of this disclosure, FIG. 3A depicts a simplified and/or representative design for a frame assembly and frames in accordance with an embodiment of the invention, and other embodiments may include frame assemblies and frames with different designs (e.g., different shapes, different configurations for holding the capacitor assembly, and/or the like).

In some embodiments, the frame assembly 370 may be configured to adjust (e.g., increase) the distance between the first PCB 302 and the second PCB 304 (e.g., to accommodate additional capacitance between the first PCB 302 and the second PCB 304, to accommodate a height of one or more components on the first PCB 302 and/or the second PCB 304, and/or the like). Additionally, or alternatively, the frame assembly 370 may be press fit, soldered, and/or the like to the pins of the first capacitor 342 and the corresponding pins of the second capacitor 344. In some embodiments, the capacitor assembly 340 may be integral to the frame assembly 370 (e.g., manufactured as a single component). Although the frame assembly 370 may introduce some parasitic inductance to the electronic module 310, such inductance is much less than a conventional pillar because the frame assembly 370 directly contacts the capacitor assembly 340 and the inductance is quickly decoupled. For example, the parasitic inductance introduced by the frame assembly 370 may be so low as to be disregarded when designing the electronic module 310.

Figure 3B:
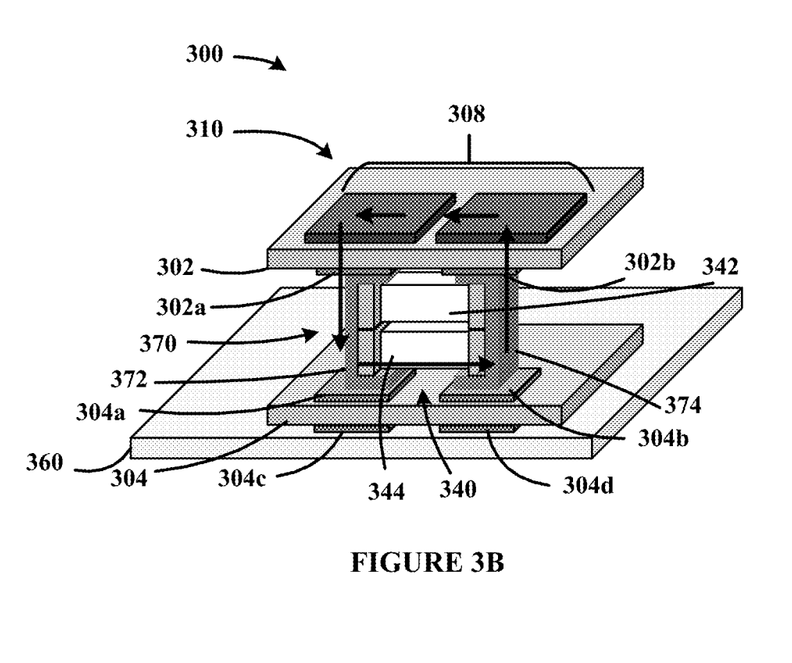
FIG. 3B is a perspective view of an electronic device including an electronic module that includes the capacitor assembly and the frame assembly of FIG. 3A, in accordance with an embodiment of the invention.

FIG. 3B is a perspective view of an electronic device 300 including an electronic module 310 that includes the capacitor assembly 340 secured within the frame assembly 370 of FIG. 3A, in accordance with an embodiment of the invention. In some embodiments, the electronic module 310 may be similar to the electronic module 210 shown and described herein with respect to FIGS. 2B, 2C, and 2D, except that the electronic module 310 may include the capacitor assembly 340 and the frame assembly 370 in place of the capacitor 250. For example, and as shown in FIG. 3B, the electronic module 310 may include the capacitor assembly 340 secured within the frame assembly 370, where the frame assembly 370 and capacitor assembly 340 are disposed and/or positioned between a first PCB 302 and a second PCB 304. As also shown in FIG. 3B, the electronic module 310 may include one or more electronic components 308 mounted on the first PCB 302. Although not shown in FIG. 3B, electronic components may also be mounted on the second PCB 304.

As shown in FIG. 3B, the first PCB 302 may include a first PCB pad 302a and a second PCB pad 302b to provide electrical and mechanical connections (e.g., via soldering) to the first frame 372 and the second frame 374, respectively. Additionally, the second PCB 304 may include a first PCB pad 304a and a second PCB pad 304b to provide electrical and mechanical connections (e.g., via soldering) to the first frame 372 and the second frame 374, respectively. As shown in FIG. 3B, the electronic device 300 may include a system board 360, and the second PCB 304 may include a third PCB pad 304c and a fourth PCB pad 304d to provide electrical and mechanical connections (e.g., via soldering) to input and output pads (not shown) of the system board 360.

Although not visible in FIG. 3B, the first PCB 302 may include vias, similar to the first via 202c and the second via 202d shown and described herein with respect to FIG. 2D, to provide electrical connections between the first frame 372 and the second frame 374, respectively, and the electronic components 308 on the top side of the first PCB 302. Additionally, the second PCB 304 may include vias, similar to the first via 204e and the second via 204f shown and described herein with respect to FIG. 2D, to provide electrical connections between the first frame 372 and the second frame 374, respectively, and the system board 360. In some embodiments, the system board 360 may not include vias to provide electrical connections between the electronic module 310 and other electronic components on the other side of the system board 360.

As will be appreciated by those of ordinary skill in the art in view of this disclosure, FIG. 3B depicts a simplified and/or representative design for an electronic module and an electronic device. For example, each of the first PCB 302 and the second PCB 304 may include more than one pair of vias (e.g., several vias with respect to a pin and/or the like).

The arrows shown in FIG. 3B represent the current path (e.g., an alternating current (AC) noise loop, a switching noise path, and/or the like) through the electronic module 310. As shown by the current path in FIG. 3B, the vias (not visible) in the first PCB 302, the first frame 372, and the second frame 374 provide electrical connections within the electronic module 310. Furthermore, the pins of the capacitors of the capacitor assembly 340 (i.e., the pins of the first capacitor 342 and the second capacitor 344), in conjunction with the first frame 372 and the second frame 374, form a portion of the current path through the electronic module 310.

Figure 4:
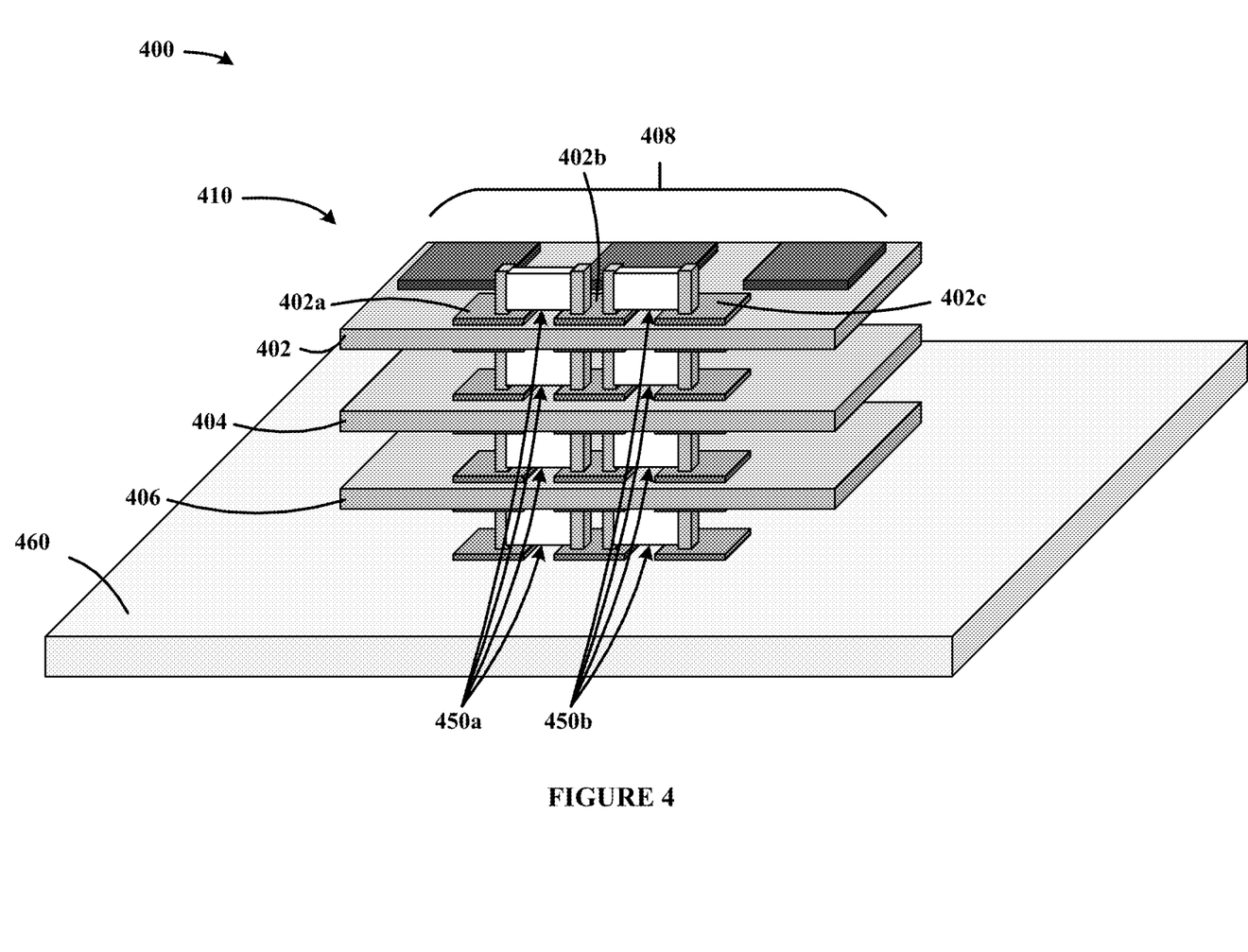
FIG. 4 is a perspective view of an electronic device including an electronic module with multiple stacked PCBs, in accordance with an embodiment of the invention.

FIG. 4 is a perspective view of an electronic device 400 including an electronic module 410 with multiple stacked PCBs 402, 404, and 406, in accordance with an embodiment of the invention. As shown in FIG. 4, the electronic device 400 may include a system board 460 (e.g., a system PCB) and the electronic module 410. As also shown in FIG. 4, the electronic module 410 may include a first PCB 402, a second PCB 404, and a third PCB 406.

In some embodiments, and as shown in FIG. 4, pairs of capacitors 450a and 450b may be disposed and/or positioned on a first surface (e.g., an upper surface) of the first PCB 402, between the first PCB 402 and the second PCB 404, between the second PCB 404 and the third PCB 406, and between the third PCB 406 and the system board 460. In some embodiments, the capacitors 450a and 450b may be similar to the capacitor 250 shown and described herein with respect to FIGS. 2A-2D. Additionally, or alternatively, the electronic module 410 may include pairs of capacitor assemblies and/or frame assemblies positioned between stacked PCBs (e.g., in place of the individual capacitors 450a and 450b) similar to the capacitor assembly 340 and the frame assembly 370 shown and described herein with respect to FIGS. 3A and 3B.

As shown in FIG. 4, the electronic device 400 includes the pair of capacitors 450a and 450b between the stacked PCBs, between the PCB adjacent the system board 460 (e.g., the third PCB 406), and on a surface of the PCB farthest from the system board 460 (e.g., the first PCB 402), rather than a single capacitor as shown and described herein with respect to FIGS. 2B-2D. In this regard, when an additional PCB is added to the electronic module 410, the electronic module 410 may include additional capacitors to provide electrical (e.g., current paths) and mechanical connections between the stacked PCBs and between the electronic module 410 and the system board 460.

In some embodiments, each of the first PCB 402, the second PCB 404, and the third PCB 406 may be similar to the first PCB 202 and/or the second PCB 204 shown and described herein with respect to FIGS. 2B-2D and/or the first PCB 302 and/or the second PCB 304 shown and described herein with respect to FIG. 3B. For example, and as shown in FIG. 4, the first PCB 402 may include one or more electronic components 408 mounted on a surface of the first PCB 402 and a set of PCB pads 402a, 402b, and 402c. In this regard, rather than a pair of PCB pads as in FIGS. 2B-2D and 3B, the first PCB 402 may include three PCB pads 402a, 402b, and 402c to provide electrical and mechanical connections to pins of the capacitors 450a and 450b. In particular, and as shown in FIG. 4, the PCB pad 402b may provide electrical and mechanical connections to a pin of one of the capacitors 450a and a pin of one of the capacitors 45b. As also shown in FIG. 4, the first PCB 402 may include another set of PCB pads (not labeled) on a surface (e.g., a lower surface) facing the second PCB 404.

As will be appreciated by those of ordinary skill in the art in view of this disclosure, the second PCB 404 and the third PCB 406 may also include sets of PCB pads and one or more electronic components. Furthermore, each of the first PCB 402, the second PCB 404, and the third PCB 406 may include vias to provide electrical connections between pins of the capacitors 450a and 450b and the electronic components on either side of the PCBs in a manner similar to the vias described herein with respect to FIG. 2D.

Although three PCBs 402, 404, and 406 are shown in FIG. 4, electronic modules in accordance with the present invention may include more than three PCBs stacked to form electronic modules with multiple layers. In this regard, for each PCB added to an electronic module design, the electronic module may include an additional capacitor between each PCB, an additional capacitor on a surface of a PCB furthest from a system board, and an additional capacitor between the electronic module and the system board. Furthermore, such electronic modules may include additional PCB pads and additional vias consistent with the concepts presented herein.

As will be appreciated by those of ordinary skill in the art in view of this disclosure, FIG. 4 depicts a simplified and/or representative design for an electronic module and an electronic device. For example, each of the PCBs 402, 404, and 406 may include more than one pair of vias (e.g., several vias with respect to a pin and/or the like). As another example, electronic modules in accordance with embodiments of the present invention may include vias in the system board and/or pillars between PCBs. However, such vias and/or pillars may not be in the current path and, therefore, may not introduce parasitic inductance into the current path of the electronic module.

Figure 5:
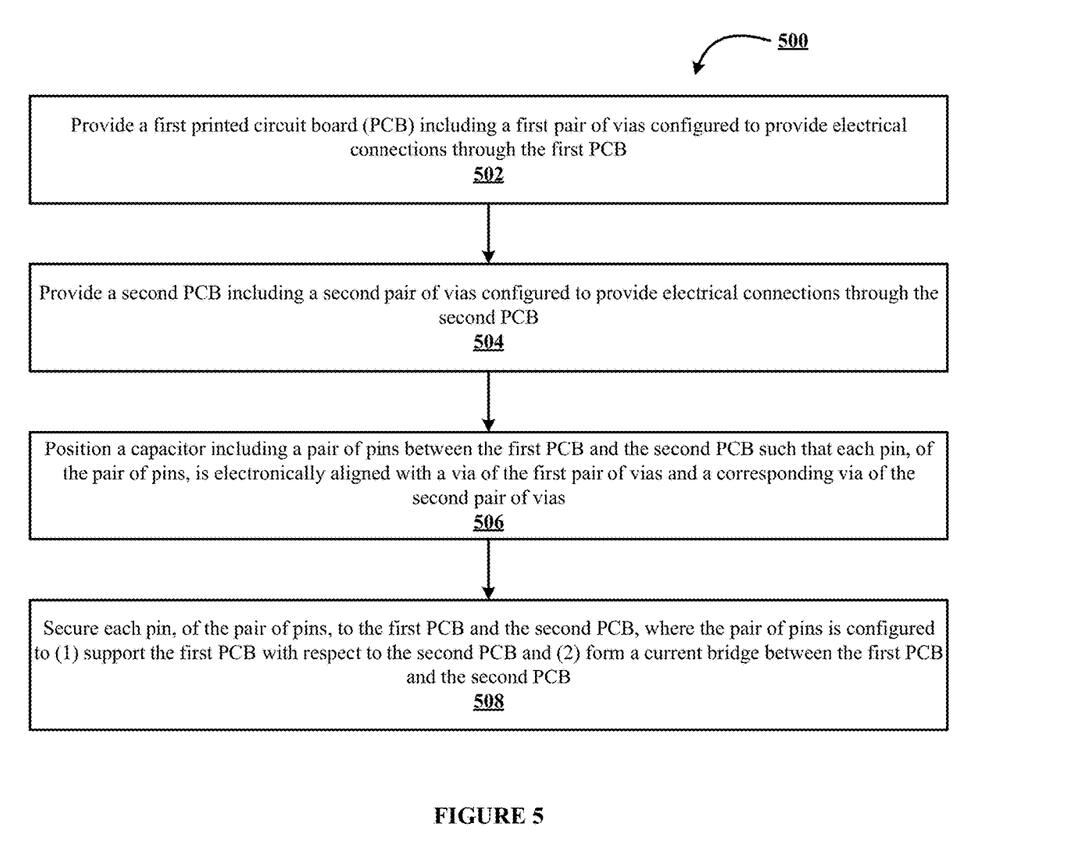
FIG. 5 illustrates a method for manufacturing an electronic device, in accordance with an embodiment of the invention.

FIG. 5 illustrates a method 500 for manufacturing an electronic device, in accordance with an embodiment of the invention. In some embodiments, the electronic device may be similar to the electronic device 200 shown and described herein with respect to FIGS. 2C and 2D and/or the electronic device 300 shown and described herein with respect to FIG. 3B. Additionally, or alternatively, the method 500 may be a method for manufacturing an electronic module, in accordance with an embodiment of the invention. For example, the electronic module may be similar to the electronic module 210 shown and described herein with respect to FIGS. 2B, 2C, and 2D and/or the electronic module 310 shown and described herein with respect to FIG. 3B.

As shown in block 502, the method 500 may include providing a first PCB including a first pair of vias configured to provide electrical connections through the first PCB. In some embodiments, the method 500 may include providing the first PCB and forming the first pair of vias in the first PCB (e.g., etching the first PCB, drilling the first PCB, electroplating the first PCB, and/or the like)

As shown in block 504, the method 500 may include providing a second PCB including a second pair of vias configured to provide electrical connections through the second PCB. In some embodiments, the method 500 may include providing the second PCB and forming the second pair of vias in the second PCB.

As shown in block 506, the method 500 may include positioning a capacitor including a pair of pins between the first PCB and the second PCB such that each pin, of the pair of pins, is electrically aligned with a via of the first pair of vias and a corresponding via of the second pair of vias. In some embodiments, the pins of the first PCB and the second PCB may be electrically aligned with the vias (e.g., positioned so as to form part of an electrical pathway), rather than physically aligned (e.g., positioned so as to be collinear). That said, in some embodiments, the pins of the first PCB and the second PCB may be electrically and physically aligned with the vias.

In some embodiments, the method 500 may include, before positioning the capacitor between the first and second PCBs, positioning a frame assembly on the capacitor. For example, the frame assembly may be configured to provide electrical connection between the pair of pins of the capacitor and (1) the first PCB using the first pair of vias and (2) the second PCB using the second pair of vias. The frame assembly may be further configured to support the first PCB with respect to the second PCB, such that the position of the first PCB with respect to the second PCB is fixed and the capacitor or capacitors held within the frame assembly are held securely in place with respect to the first and second PCBs.

As shown in block 508, the method 500 may include securing each pin, of the pair of pins, to the first PCB and the second PCB, where the pair of pins is configured to (1) support the first PCB with respect to the second PCB and (2) form a current bridge between the first PCB and the second PCB. For example, the method 500 may include securing the pins by soldering the pins to the PCBs.

In some embodiments, the method 500 may include, before securing each pin to the first PCB, forming a first pair of pads on the first PCB, where each pad of the first pair of pads is configured to electrically connect to a via of the first pair of vias, and securing each pin to the first PCB may include securing each pin, of the pair of pins, to a pad of the first pair of pads. Additionally, or alternatively, the method 500 may include, before securing each pin to the second PCB, forming a second pair of pads on the second PCB, where each pad of the second pair of pads is configured to electrically connect to a via of the second pair of vias and securing each pin to the second PCB may include securing each pin, of the pair of pins, to a pad of the second pair of pads.

In some embodiments, the method 500 may include positioning and securing one or more electronic components on a distal side of the first PCB with respect to the capacitor such that the one or more electronic components is electrically connected to each via of the first pair of vias. Additionally, or alternatively, the method 500 may include positioning the second PCB such that a first via of the second pair of vias is aligned with an input pad of a system board and a second via of the second pair of vias is aligned with an output pad of the system board and further securing the second PCB to the system board, such as by soldering.

Method 500 may include additional embodiments, such as any single embodiment or any combination of embodiments described herein. Although FIG. 5 shows example blocks of method 500, in some embodiments, method 500 may include additional blocks, fewer blocks, different blocks, or differently arranged blocks than those depicted in FIG. 5. Additionally, or alternatively, two or more of the blocks of method 500 may be performed in parallel.

As will be appreciated by one of ordinary skill in the art in view of this disclosure, the present invention may include and/or be embodied as an apparatus (including, for example, a system, a machine, a device, and/or the like), as a method (including, for example, a manufacturing method, a robot-implemented process, and/or the like), or as any combination of the foregoing.

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications, and substitutions, in addition to those set forth in the above paragraphs, are possible. Those skilled in the art will appreciate that various adaptations, modifications, and combinations of the just described embodiments may be configured without departing from the scope and spirit of the invention. For example, devices, modules, components, and/or elements shown in the figures are not necessarily drawn to scale and may vary from that shown without departing from the scope and spirit of the invention. Therefore, it is to be understood that, within the scope of the appended claims, the invention may be practiced other than as specifically described herein.

What is claimed is:

1. An electronic module, comprising:
   a first printed circuit board (PCB) comprising a first pair of vias configured to provide electrical connections through the first PCB;
   a second PCB comprising a second pair of vias configured to provide electrical connections through the second PCB; and
   a first capacitor positioned between the first PCB and the second PCB, wherein the first capacitor comprises a pair of pins, wherein each pin is aligned with a via of the first pair of vias and a corresponding via of the second pair of vias such that each pin is configured to provide electrical connection between the first PCB and the second PCB, and wherein the pair of pins is configured to support the first PCB with respect to the second PCB;
   a third PCB having a first side and a second side;
   a second capacitor positioned between the first PCB and the second PCB;
   a third capacitor and a fourth capacitor positioned between the second PCB and the first side of the third PCB; and
   a fifth capacitor and a sixth capacitor positioned on the second side of the third PCB.

2. The electronic module of claim 1, further comprising one or more electronic components on a distal side of the first PCB with respect to the first capacitor, wherein the one or more electronic components is configured to be electrically connected to each via of the first pair of vias.

3. The electronic module of claim 1, comprising one or more electronic components on a distal side of the second PCB with respect to the first capacitor, wherein the one or more electronic components is configured to be electrically connected to each via of the second pair of vias.

4. The electronic module of claim 1, wherein:
   the first PCB comprises a first pair of pads, wherein each pad of the first pair of pads is configured to electrically connect the first pair of vias to the pair of pins; and
   the second PCB comprises a second pair of pads, wherein each pad of the second pair of pads is configured to electrically connect the second pair of vias to the pair of pins.

5. The electronic module of claim 1, wherein each pin of the pair of pins comprises:
   a first surface affixed to the first PCB; and
   a second surface affixed to the second PCB.

6. The electronic module of claim 1, wherein the pair of pins of the first capacitor form a current bridge between the first PCB and the second PCB.

7. The electronic module of claim 1, wherein the first capacitor comprises a dielectric material disposed between the pair of pins.

8. The electronic module of claim 1, wherein the second pair of vias of the second PCB is configured to provide electrical connection between the second PCB and a system PCB.

9. The electronic module of claim 1, further comprising a frame assembly, wherein the frame assembly is configured to:
   provide electrical connection between the pair of pins of the first capacitor and (1) the first PCB using the first pair of vias and (2) the second PCB using the second pair of vias; and
   support the first PCB with respect to the second PCB.

10. The electronic module of claim 1, comprising:
    a first electronic component on a distal side of the first PCB with respect to the first capacitor, wherein the first electronic component is configured to be electrically connected to each via of the first pair of vias; and
    a second electronic component on a distal side of the second PCB with respect to the first capacitor, wherein the second electronic component is configured to be electrically connected to each via of the second pair of vias.

11. A method of manufacturing an electronic device, the method comprising:
    providing a first printed circuit board (PCB) comprising a first pair of vias configured to provide electrical connections through the first PCB;
    providing a second PCB comprising a second pair of vias configured to provide electrical connections through the second PCB;
    positioning a first capacitor comprising a pair of pins between the first PCB and the second PCB such that each pin, of the pair of pins, is electrically aligned with a via of the first pair of vias and a corresponding via of the second pair of vias; and
    securing each pin, of the pair of pins, to the first PCB and the second PCB;
    wherein the pair of pins is configured to (1) support the first PCB with respect to the second PCB and (2) form a current bridge between the first PCB and the second PCB;
    providing a third PCB having a first side and a second side;
    positioning a second capacitor between the first PCB and the second PCB;

positioning a third capacitor and a fourth capacitor between the second PCB and the first side of the third PCB; and positioning a fifth capacitor and a sixth capacitor on the second side of the third PCB.

12. The method of claim 11, comprising:

forming the first pair of vias in the first PCB; and forming the second pair of vias in the second PCB.

13. The method of claim 11, comprising positioning and securing one or more electronic components on a distal side of the first PCB with respect to the first capacitor such that the one or more electronic components is electrically connected to each via of the first pair of vias.

14. The method of claim 11, comprising:

before securing each pin to the first PCB, forming a first pair of pads on the first PCB, wherein each pad of the first pair of pads is configured to electrically connect to a via of the first pair of vias; and before securing each pin to the second PCB, forming a second pair of pads on the second PCB, wherein each pad of the second pair of pads is configured to electrically connect to a via of the second pair of vias;

wherein securing each pin to the first PCB comprises securing each pin, of the pair of pins, to a pad of the first pair of pads, and wherein securing each pin to the second PCB comprises securing each pin, of the pair of pins, to a pad of the second pair of pads.

15. The method of claim 11, comprising:

positioning the second PCB such that a first via of the second pair of vias is aligned with an input pad of a system board and a second via of the second pair of vias is aligned with an output pad of the system board; and securing the second PCB to the system board.

16. The method of claim 11, comprising:

before positioning the first capacitor, positioning a frame assembly on the first capacitor, wherein the frame assembly is configured to:

provide electrical connection between the pair of pins of the first capacitor and (1) the first PCB using the first pair of vias and (2) the second PCB using the second pair of vias; and support the first PCB with respect to the second PCB.

* * * * *

UNITED STATES PATENT AND TRADEMARK OFFICE
CERTIFICATE OF CORRECTION

PATENT NO. : 12,156,333 B2
APPLICATION NO. : 17/886618
DATED : November 26, 2024
INVENTOR(S) : Xiuzhuang Yang et al.

It is certified that error appears in the above-identified patent and that said Letters Patent is hereby corrected as shown below:

On the Title Page

Under Item (72)
1) Please change the residence information for inventor Xiuzhuang Yang to Shenzhen (CN)
2) Please change the residence information for inventor Huiying Chen to Shenzhen (CN)
3) Please change the residence information for inventor Weibin He to Shenzhen (CN)
4) Please change the residence information for inventor Di Wu to Shenzhen (CN)

Signed and Sealed this
Seventh Day of January, 2025

Derrick Brent
*Acting Director of the United States Patent and Trademark Office*